(12) United States Patent
Cideciyan et al.

(10) Patent No.: US 10,824,346 B2
(45) Date of Patent: *Nov. 3, 2020

(54) LOGICAL FORMAT UTILIZING LATERAL ENCODING OF DATA FOR STORAGE ON MAGNETIC TAPE

(71) Applicant: International Business Machines Corporation, Armonk, NY (US)

(72) Inventors: Roy D. Cideciyan, Rueschlikon (CH); Simeon Furrer, Altdorf (CH); Ernest S. Gale, Tucson, AZ (US); Mark A. Lantz, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,306

(22) Filed: May 3, 2019

(65) Prior Publication Data

US 2019/0258413 A1      Aug. 22, 2019

Related U.S. Application Data

(63) Continuation of application No. 15/380,983, filed on Dec. 15, 2016, now Pat. No. 10,379,756.

(51) Int. Cl.
*G06F 3/06* (2006.01)
*H03M 13/29* (2006.01)
(Continued)

(52) U.S. Cl.
CPC ............ *G06F 3/0619* (2013.01); *G06F 3/064* (2013.01); *G06F 3/0655* (2013.01);
(Continued)

(58) Field of Classification Search
CPC .... G06F 3/0619; G06F 3/0682; G06F 3/0655; G06F 3/064; G06F 11/1076; H03M 13/1515; H03M 13/27
See application file for complete search history.

(56) References Cited

U.S. PATENT DOCUMENTS

| | | |
|---|---|---|
| 5,841,794 A | 11/1998 | Inoue et al. |
| 6,282,039 B1 | 8/2001 | Bartlett |

(Continued)

FOREIGN PATENT DOCUMENTS

| | | |
|---|---|---|
| CN | 1053508 A | 7/1991 |
| CN | 1732533 A | 2/2006 |

(Continued)

OTHER PUBLICATIONS

Corrected Notice of Allowance from U.S. Appl. No. 15/380,983, dated Jun. 27, 2019.
(Continued)

*Primary Examiner* — April Y Blair
*Assistant Examiner* — Rong Tang
(74) *Attorney, Agent, or Firm* — Zilka-Kotab, P.C.

(57) ABSTRACT

In one general embodiment, a method includes receiving data logically organized into a predetermined number of two-dimensional arrays, each two-dimensional array including a plurality of NS codewords positioned orthogonally to a plurality of WS codewords. The method also includes successively writing each of the NS codewords to a data storage medium. A first NS codeword from a first two-dimensional array is written to the data storage medium prior to starting to write a second NS codeword from the first two-dimensional array. Also, the plurality of NS codewords are protected with a stronger encoding than the plurality of WS codewords.

20 Claims, 14 Drawing Sheets

(51) Int. Cl.
*G06F 11/10* (2006.01)
*H03M 13/27* (2006.01)
*H03M 13/15* (2006.01)

(52) U.S. Cl.
CPC ........ *G06F 3/0682* (2013.01); *G06F 11/1076* (2013.01); *H03M 13/27* (2013.01); *H03M 13/2909* (2013.01); *H03M 13/1515* (2013.01)

(56) References Cited

U.S. PATENT DOCUMENTS

| | | |
|---|---|---|
| 7,388,525 B2 | 6/2008 | Miyauchi et al. |
| 7,849,388 B2 | 12/2010 | Esumi et al. |
| 8,611,039 B2 | 12/2013 | Fasen |
| 8,902,929 B2 | 12/2014 | Ordentlich et al. |
| 8,910,012 B2 | 12/2014 | Blaum et al. |
| 10,120,599 B2 | 11/2018 | Cideciyan et al. |
| 10,379,756 B2 | 8/2019 | Cideciyan et al. |
| 2006/0120244 A1 | 6/2006 | Miyauchi et al. |
| 2007/0110188 A1 | 5/2007 | Esumi et al. |
| 2008/0075201 A1 | 3/2008 | Limberg |
| 2010/0177421 A1 | 7/2010 | Demura et al. |
| 2012/0019948 A1 | 1/2012 | Fasen |
| 2012/0087381 A1 | 4/2012 | Ordentlich et al. |
| 2014/0108881 A1 | 4/2014 | Blaum et al. |
| 2016/0329914 A1 | 11/2016 | Cideciyan et al. |
| 2018/0173439 A1 | 6/2018 | Cideciyan et al. |
| 2018/0173440 A1 | 6/2018 | Cideciyan et al. |

FOREIGN PATENT DOCUMENTS

| | | |
|---|---|---|
| CN | 1791906 A | 6/2006 |
| CN | 101091214 A | 12/2007 |
| CN | 106020716 A | 10/2016 |
| GB | 2197509 A | 5/1988 |
| JP | 2004295958 A | 10/2004 |

OTHER PUBLICATIONS

List of IBM Patents or Patent Applications Treated as Related.
Cideciyan et al., U.S. Appl. No. 15/380,983, filed Dec. 15, 2016.
Cideciyan et al., U.S. Application No. 15/380,987, filed Dec. 15, 2016.
Non-Final Office Action from U.S. Appl. No. 15/380,987, dated Feb. 26, 2018.
Non-Final Office Action from U.S. Appl. No. 15/380,983, dated Mar. 8, 2018.
Combined Search and Examination Report from European Application No. GB1720581.6, dated Apr. 25, 2018.
Notice of Allowance from U.S. Appl. No. 15/380,987, dated Jun. 29, 2018.
Corrected Notice of Allowance from U.S. Appl. No. 15/380,987, dated Jul. 25, 2018.
Final Office Action from U.S. Application No. 15/380,983, dated Aug. 16, 2018.
Corrected Notice of Allowance from U.S. Appl. No. 15/380,987, dated Sep. 6, 2018.
Notice of Allowance from U.S. Appl. No. 15/380,983, dated Mar. 29, 2019.
Office Action from Chinese Patent Application No. 201711215775.0, dated Aug. 23, 2019.

| | 1 | 2 | ... | P | ... | 2P | ... | $N_wP$ |
|---|---|---|---|---|---|---|---|---|
| 1 | $(1,1)_1$ | $(1,2)_1$ | ... | $(1,P)_1$ | $(2,1)_1$ $(2,2)_1$ | $(2,P)_1$ | ... $(N_w,1)_1(N_w,2)_1$ ... | $(N_w,P)_1$ |
| 2 | $(1,1)_2$ | $(1,2)_2$ | ... | $(1,P)_2$ | $(2,1)_2$ $(2,2)_2$ | $(2,P)_2$ | ... $(N_w,1)_2(N_w,2)_2$ ... | $(N_w,P)_2$ |
| 3 | | | | | | | | |
| ... | | | ... | | ... | | ... | |
| $K_n$ | | | | | | | | |

FIG. 10

|   | 1 | 2 | 3 |  | J |
|---|---|---|---|---|---|
| 1 | $(1)_1$ | $(1)_2$ | $(1)_3$ |  | $(1)_J$ |
| 2 | $(2)_J$ | $(2)_1$ | $(2)_2$ |  | $(2)_{J-1}$ |
| 3 | $(3)_{J-1}$ | $(3)_J$ | $(3)_1$ |  | $(3)_{J-2}$ |
|  |  |  | ... |  |  |
| J-1 | $(J-1)_3$ | $(J-1)_4$ | $(J-1)_5$ |  | $(J-1)_2$ |
| J | $(J)_2$ | $(J)_3$ | $(J)_4$ |  | $(J)_1$ |
|  |  |  | ... |  |  |
| $N_n$-1 | $(N_n-1)_3$ | $(N_n-1)_4$ | $(N_n-1)_5$ |  | $(N_n-1)_2$ |
| $N_n$ | $(N_n)_2$ | $(N_n)_3$ | $(N_n)_4$ |  | $(N_n)_1$ |

LOGICAL FORMAT UTILIZING LATERAL ENCODING OF DATA FOR STORAGE ON MAGNETIC TAPE

BACKGROUND

The present invention relates to a logical format for storage of data on magnetic tape, and more particularly, to a logical format utilizing lateral encoding.

Error correction coding (ECC) in linear tape open (LTO) and enterprise tape drives is used to ensure that the byte error rate (BER) at the output of the ECC decoder is less than about $1 \times 10^{-19}$ even though the BER at the output of the detector may be around $1 \times 10^{-3}$. Furthermore, ECC is able to correct large spatial errors on magnetic tape. In particular, ECC is able to correct some large burst errors due to media defects. It is also capable of correcting all errors in a lateral tape stripe of large width which may occur due to instantaneous speed variations during tape transport from one reel to the other reel of a tape cartridge. Finally, ECC is able to correct a large number of dead tracks due to, e.g., temporarily or permanently non-functioning reader elements in the magnetic tape head of the tape drive. Modern tape drives are able to correct M/8 dead tracks, where M is the total number of tracks that are simultaneously written onto and read from the magnetic tape.

In tape storage, relatively long (about 1 kB) longitudinal interleaved error correction codewords, which are commonly referred to as codeword interleaves (CWI-4) consisting of four byte-interleaved row codewords from four different product codewords, are written on tracks of the magnetic tape. In current receiver architectures that perform a single pass through the digital front-end functions and detection, the decoding latency associated with read codewords is prohibitively large for decoded bits to be used to drive decision-directed digital front-end functions. Clearly, large delays in decision-directed loops are not desirable and therefore should be avoided. Such a scheme would introduce an unmanageable amount of latency to the reading and decoding process in current tape drive read architectures. In receiver architectures that iterate between decoder and digital front-end functions, the buffer size used to store the samples at the output of the analog-to-digital (A/D) converter is very large when decoded bits in current tape ECC architectures are used to drive decision-directed digital front-end functions during a second and subsequent iterations. Furthermore, the error correction capability of these longitudinal codewords in current tape drives is relatively weak.

SUMMARY

In one embodiment, a method includes receiving data logically organized into a predetermined number of two-dimensional arrays, each two-dimensional array including a plurality of NS codewords positioned orthogonally to a plurality of WS codewords. The method also includes successively writing each of the NS codewords to a data storage medium. A first NS codeword from a first two-dimensional array is written to the data storage medium prior to starting to write a second NS codeword from the first two-dimensional array. Also, the plurality of NS codewords are protected with a stronger encoding than the plurality of WS codewords.

In another embodiment, a data storage drive includes a processing circuit, and logic integrated with the processing circuit, executable by the processing circuit, or integrated with and executable by the processing circuit. The logic is configured to cause the processing circuit to perform the foregoing method.

In another embodiment, a computer program product includes a computer readable storage medium having program instructions embodied therewith. The embodied program instructions are executable by a processing circuit to cause the processing circuit to perform the foregoing method.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 10 shows distribution of data along M tracks of a magnetic tape, according to one embodiment.

FIG. 11 shows distribution of data along M tracks of a magnetic tape, according to another embodiment.

FIG. 12 shows distribution of data along M tracks of a magnetic tape, according to still another embodiment.

DETAILED DESCRIPTION

Figure 1:
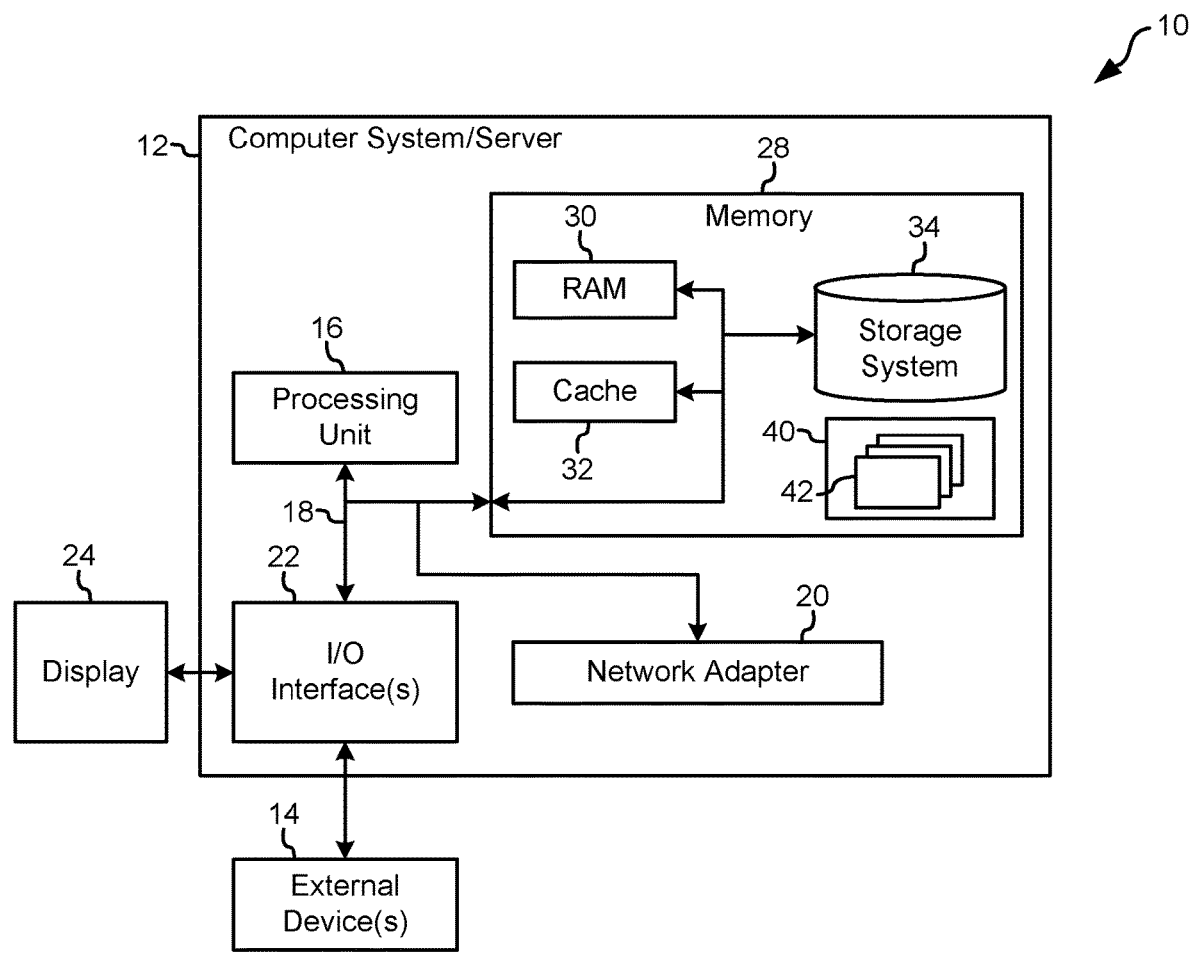
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "about" as used herein indicates the value preceded by the term "about," along with any values reasonably close to the value preceded by the term "about," as would be understood by one of skill in the art. When not indicated otherwise, the term "about" denotes the value preceded by the term "about"±10% of the value. For example, "about 10" indicates all values from and including 9.0 to 11.0.

Due to the limitations associated with current tape drive encoding schemes, a new logical format for magnetic tape that provides high data integrity and large capability of burst error correction in conjunction with enabling performance improvements without requiring large decoding latencies and large buffer sizes would be beneficial.

The following description discloses several preferred embodiments of systems, methods, and computer program products configured to utilize a logical format for storage of data on magnetic tape that utilizes improved lateral encoding.

One embodiment is based on encoding data words in a Data Set (DS) as a predetermined number (P) of two-dimensional (2D) product codewords and writing the columns of the 2D product codewords as a plurality of narrow-spread codewords (super slim, e.g., equal to or less than about 1.2 microns in longitudinal tape space) from a 2D product codeword across a predetermined number (M) of tracks of a magnetic tape. The symbols in the rows of the 2D product codewords are uniformly sprinkled (separated logically) within a plurality of wide-spread codewords (extra wide, e.g., equal to or greater than about 80 mm in longitudinal tape space) along one track of the magnetic tape. Some benefits of this approach include low latency during the process of decoding the narrow-spread codewords and improved error-rate performance due to usage of low-latency decoded bits to drive decision-directed digital front-end functions without degrading burst-error correction performance due to the strength of the encoding used. There is potential to allow receiver operation at signal-to-noise ratios (SNRs) that are about 2 to 3 dB less than current operating SNRs for the read channel in a tape drive.

Error correction codewords that are spatially distributed both along and across the tracks of the magnetic tape and yet have a very narrow spread along the tracks are written on the magnetic tape, e.g., very small longitudinal length along the magnetic tape, such as about 1.2 microns or less, assuming a linear density of 500 kilobits per inch (kbpi) and a narrow-spread (e.g., (96, 84) Reed-Solomon (RS) or similar) code being used to encode the data. The combination of spatially distributed coding with small longitudinal length, interleaved concatenated coding, and deep interleaving in a magnetic tape layout results in a powerful encoded data format. The spatially distributed codewords written on magnetic tape are able to assume various shapes and patterns, such as a saw-tooth pattern in one approach. In this embodiment, when used in conjunction with iterative error correction decoding, further performance improvements are possible with small decoding latencies and small buffer sizes, both advantages over current formats, structures, and performance metrics.

In one general embodiment, a method includes receiving data logically organized into a predetermined number of two-dimensional arrays, each two-dimensional array including a plurality of NS codewords positioned orthogonally to a plurality of WS codewords. The method also includes successively writing each of the NS codewords to a data storage medium. A first NS codeword from a first two-dimensional array is written to the data storage medium prior to starting to write a second NS codeword from the first two-dimensional array. Also, the plurality of NS codewords are protected with a stronger encoding than the plurality of WS codewords.

In another general embodiment, a data storage drive includes a processing circuit, and logic integrated with the processing circuit, executable by the processing circuit, or integrated with and executable by the processing circuit. The logic is configured to cause the processing circuit to perform the foregoing method.

In another general embodiment, a computer program product includes a computer readable storage medium having program instructions embodied therewith. The embodied program instructions are executable by a processing circuit to cause the processing circuit to perform the foregoing method.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as RAM 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media, a tape drive for reading from or writing to a removable tape cartridge having a magnetic tape medium stored therein, etc., may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2A:
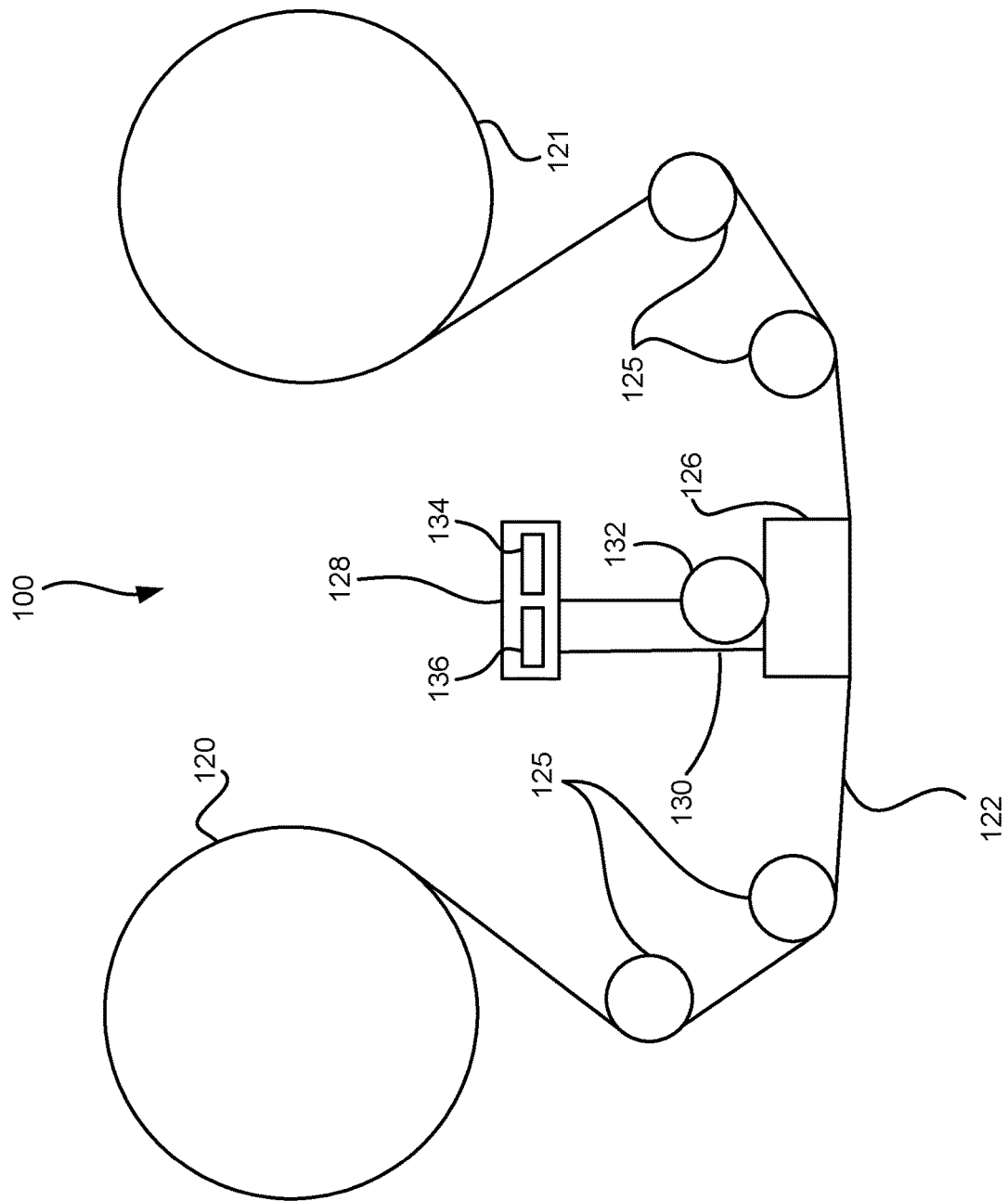
FIG. 2A shows a tape drive according to one embodiment.

FIG. 2A illustrates a simplified tape drive 100 of a tape-based data storage system, which may be employed in the context of the present invention. While one specific implementation of a tape drive is shown in FIG. 2A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 2A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the tape drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 2B:
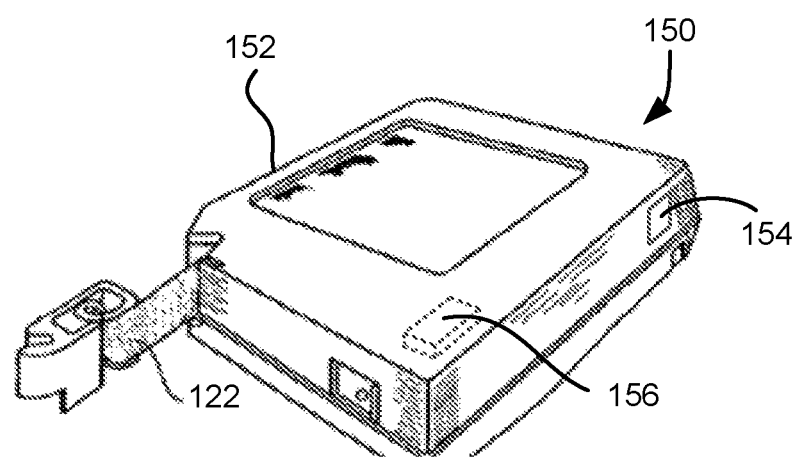
FIG. 2B shows a tape cartridge that may be used with the tape drive of FIG. 2A, according to one embodiment.

FIG. 2B illustrates an exemplary tape cartridge 150 according to one embodiment. Such tape cartridge 150 may be used with a system such as that shown in FIG. 2A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 2B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 3:
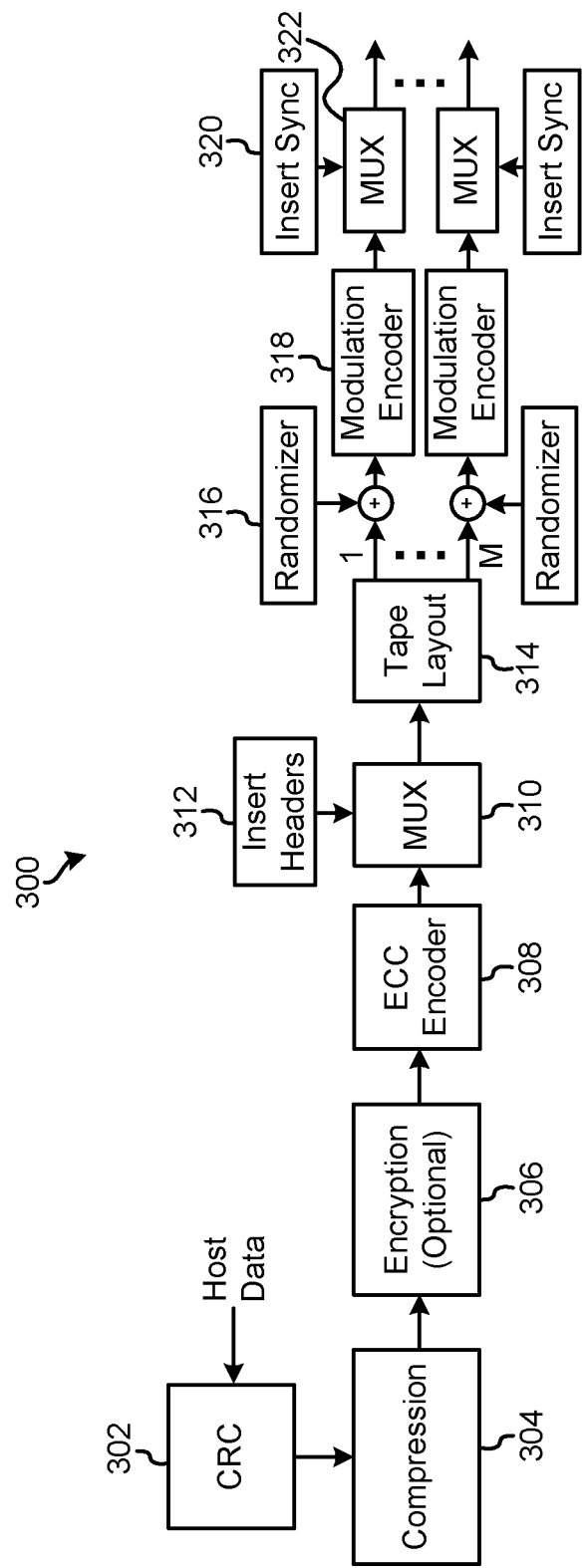
FIG. 3 illustrates a conceptual data flow in a tape drive in accordance with one embodiment.

Now referring to FIG. 3, a data flow 300 for encoding host data in a tape drive with M simultaneously written tracks is shown according to one embodiment. As shown, the data flow 300 includes the operations of a cyclic redundancy check (CRC) encoder 302, a compression module 304, an optional encryption module 306, one or more error correction code (ECC) encoder modules 308, a multiplexer 310 for adding headers 312 to encoded data, tape layout addition module 314, randomizers 316 for data randomization in each tape channel 1 to M, modulation encoders 318 for each tape channel 1 to M, and multiplexers 322 for inserting synchronization patterns 320 for each tape channel 1 to M.

Typically, there are 32 channels in an enterprise tape drive, and therefore M=32, but any number of channels may be included in a tape drive. Other numbers of channels that are also possible include 8 channels, 16 channels, 64 channels, etc. A CWI-4 set comprises a fixed number, M, of concurrently written CWI-4s, the fixed number being equal to the number of channels in the writer.

There are typically five different types of overhead in data written to tape. These types of overhead include ECC, which is applied using one or more ECC encoders 308, modulation encoding which is applied using one or more modulation encoders 318, insertion of headers 312, insertion of synchronization patterns 320, and rewriting data following a read-while-write process to ensure the data integrity of the data first written. The format efficiency of a typical tape drive due to these sources of overhead, with the exception of rewriting, is about 79%, i.e., every 100 bits written onto tape are produced from only 79 bits of user data, and the added redundancy of overhead bits is 21 bits. User data in this context is the host data received at the input of the ECC encoder 308. Furthermore, about 3% of the tape storage space is reserved for rewriting data.

Figure 4:
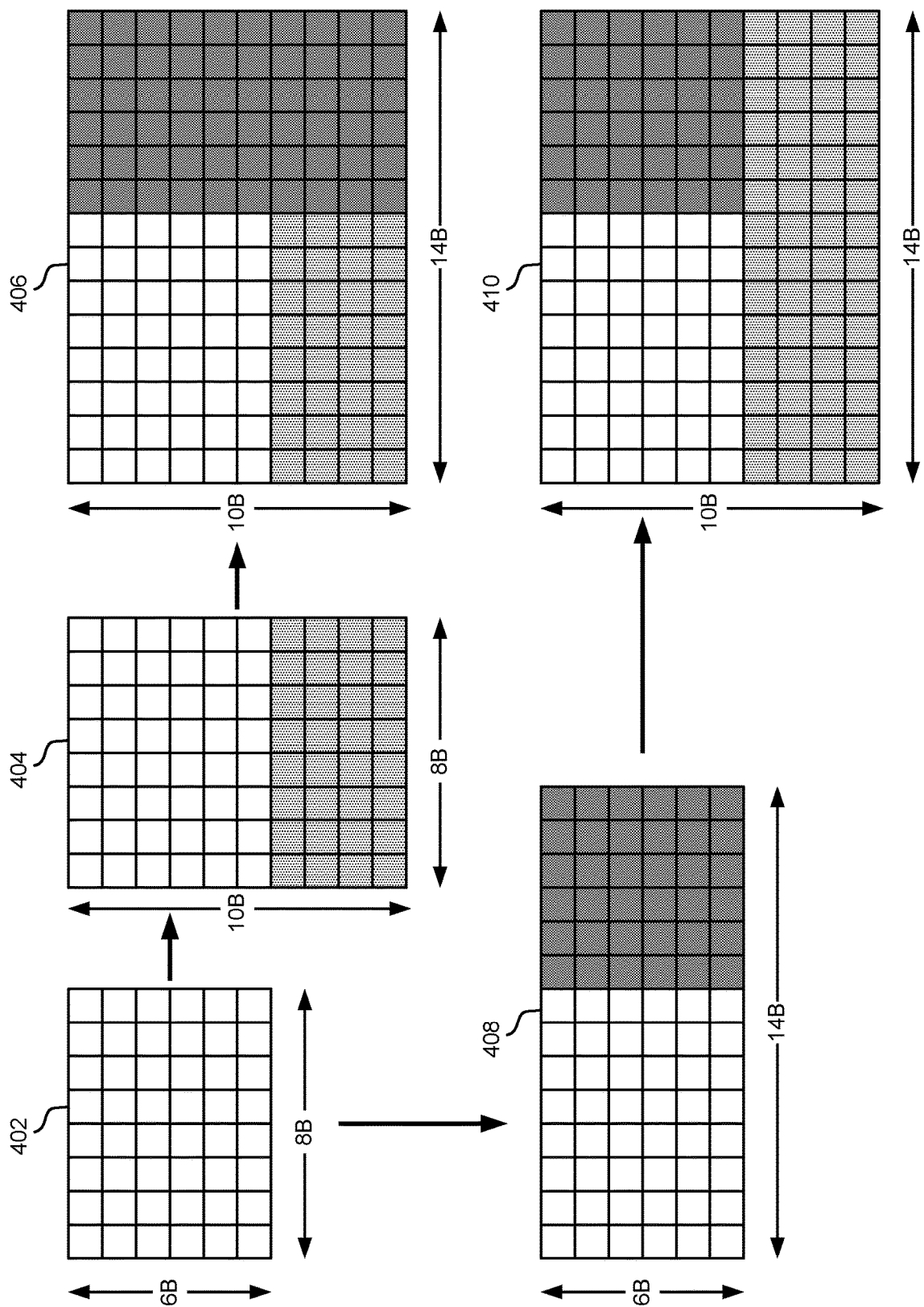
FIG. 4 shows simplified data encoding using a two-dimensional logical array.

ECC may be applied to data on a product codeword basis. As shown in FIG. 4, data may be arranged into a two-dimensional data array 402. Data array 402 is shown as being a 6×8 array, but any conceivable size of data array may be used, depending on storage constraints, processing power, error-rate performance requirements, and other tangible factors. However, for simplicity in this discussion, a 6×8 data array 402 is shown.

In a first embodiment, rows may be encoded first. For example, 6 bytes of parity may be added to each row, resulting in C1 codewords in each row of a 6×14 row-encoded array 408. Each C1 codeword is encoded using a [14, 8, 7] C1 code. Then, the columns may be encoded by adding 4 bytes of parity to each column, resulting in C2 codewords in each column (and C1 codewords in each row) of a 10×14 encoded array 410. Each C2 codeword is encoded using a [10, 6, 5] C2 code.

In a second embodiment, columns may be encoded first. For example, 4 bytes of parity may be added to each column, resulting in C2 codewords in each column of a 10×8 column-encoded array 404. Each C2 codeword is encoded using a [10, 6, 5] C2 code. Then, the rows may be encoded by adding 6 bytes of parity to each row, resulting in C1 codewords in each row (and C2 codewords in each column) of a 10×14 encoded array 406. Each C1 codeword is encoded using a [14, 8, 7] C1 code. Regardless of whether the rows are encoded first, or the columns are encoded first, the resulting 10×14 arrays 406, 410 are identical, and are considered to be [140, 48, 35] product codewords.

In a more realistic example, the C1 code may be a [240, 230, 11] RS code, the C2 code may be a [192, 168, 25] RS code, but regardless of the C1 and C2 codes used, every row in a product codeword is a C1 codeword, and every column in a product codeword is a C2 codeword. The distance of a product code is the product of the distances of its component C1 and C2 codes. Furthermore, before or after encoding, headers may be added to each row of the array to form headerized rows.

In a further embodiment, two or more product codewords may be combined into a larger two-dimensional array, referred to as a sub data set (SDS). In one embodiment, four product codewords may be column-interleaved together to form a SDS, with all four first columns of the four product codewords being columns one to four of the SDS, all four second columns of the four product codewords being columns five to eight of the SDS, etc. The row of SDS is referred to as a codeword interleave (CWI), and since four C1 codewords are interleaved together, it is specifically referred to as a CWI-4. In this way, the four product codewords are interleaved into a SDS, with headers added to each row of the SDS. Then, each row of the SDS is written to magnetic tape as a packet of data using the plurality of M tape channels available to simultaneously write M packets that typically belong to M different SDS to the tape.

Each data set that is received by a tape drive for writing to a magnetic tape is processed prior to being written. The data set may be split into a plurality of SDSs, each SDS being organized into a two-dimensional data symbol array, such as that shown in FIG. 4. Each row in the 10×14 arrays 406, 410 comprises one or more C1 codewords, while each column in the 10×14 arrays 406, 410 comprises one or more C2 codewords. In linear tape open (LTO), each encoded-SDS includes two (for generations LTO 1-LTO 4) or four (LTO 5-LTO 7) C1 codewords in the rows. However, anywhere from one to eight or more C1 codewords may be included in each row of the array. Usually, hundreds or even thousands of headers are assigned to a single data set because each data set includes multiple SDSs and each row of a column-encoded SDS is assigned a header (one header per row). Each header may include 12 bytes, or more or less, that are associated on a one-by-one basis with the rows of the column-encoded SDS.

When the C1 encoding takes place prior to the C2 encoding, as shown in row-encoded array 408, the C2 column parity extends along the entire length of each row of 408 in the C2 column parity portion of the 10×14 array 410. The C1 row parity is positioned at the end of each row outside of the C2 column parity area of the 10×14 array 410. However, the C1 codewords are still present even across the C2 column parity area. This is a property of the product code construction where the order of C1 and C2 extension may be interchanged without having an impact on the product codeword, i.e., all rows are from one code and all columns are from another code independent of the order of C1 and C2 extension. Therefore, the last columns of the C2 column parity area may be interpreted either as C1 parity or as C2 parity.

According to one embodiment, where each row includes four C1 codewords interleaved into the entirety of the row, referred to as a CWI-4, each C1 codeword may have 230 bytes of data, with the additional C1 parity adding an additional 10 bytes. Since four C1 codewords are interleaved in each row in this embodiment, each row (a row is one CWI-4) has 4×230 bytes+4×10 bytes=960 bytes. Furthermore, in this embodiment, there may be 96 rows in each SDS array, or more or less rows in other embodiments.

In addition, the headers, in one approach, may be 12 bytes long. This results in a total size of a SDS two-dimensional array being (960+12)*96=93,312 bytes, with no ECC encoding for the headers.

Furthermore, in one approach, the C1 code may comprise a RS(240, 230, 11) code over the Galois field GF(256), and the C2 code may comprise a RS(96, 84, 13) code over GF(256).

In more approaches, the length of a CWI-4 (984 bytes, each codeword being 246 bytes) and header (12 bytes) may be 996 bytes. In another approach, the length of a CWI-4 and header combined may be 1000 bytes, 1004 bytes, or some other value suitable for encoding the CWI-4 and header information with a desired level of protection.

As data is stored to magnetic tape, a plurality of CWI-4s are dispersed across the tape channels, with each set of CWI-4s that are written concurrently to tape being referred to as a CWI-4 set. When the magnetic tape has 32 tracks, and the tape drive has 32 tape channels, a CWI-4 set includes 32 headerized CWI-4s, each from a different SDS. Also, when the C1 code is a [240, 230, 11] RS code and the C2 code is a [192, 168, 25] RS code, there will be 384 CWI-4 sets per data set. In this embodiment, a single CWI-4 from various different SDSs are written concurrently, thereby increasing data protection in case of read or write errors, such as skew errors, etc., that affect all data being written at a given time.

Furthermore, when data is determined to be improperly written during a read-while-write process, it will be rewritten to the rewrite section of the tape, located subsequent to the first write area of a data set on the tape.

After modulation encoding two headerized CWI-4s (2 packets), synchronized codeword objects (SCOs) are formed by inserting synchronization patterns between the packets and writing the SCOs onto the tracks of the tape. When the tape has 32 tracks, there are 32 SCOs in a SCO set. When writing is interrupted, any data set for which all the SCO sets have not been successfully recorded and subsequently verified after read-while-write processing is considered to be an interrupted data set. Therefore, the written granularity of a data set is a single SCO set. Each data set is separated when written to tape by a data set separator (DSS) sequence, and two different variable frequency oscillator (VFO) sequences are used to acquire timing, with VFO1 being 445 bits long, and VFO2 being 197 bits long. These synchronization patterns are also stored to tape. The longer VFO1 pattern is written before the first SCO set and after the last SCO set in a data set whereas the shorter VFO2 pattern is written between any two SCO sets in a data set.

Figure 5:
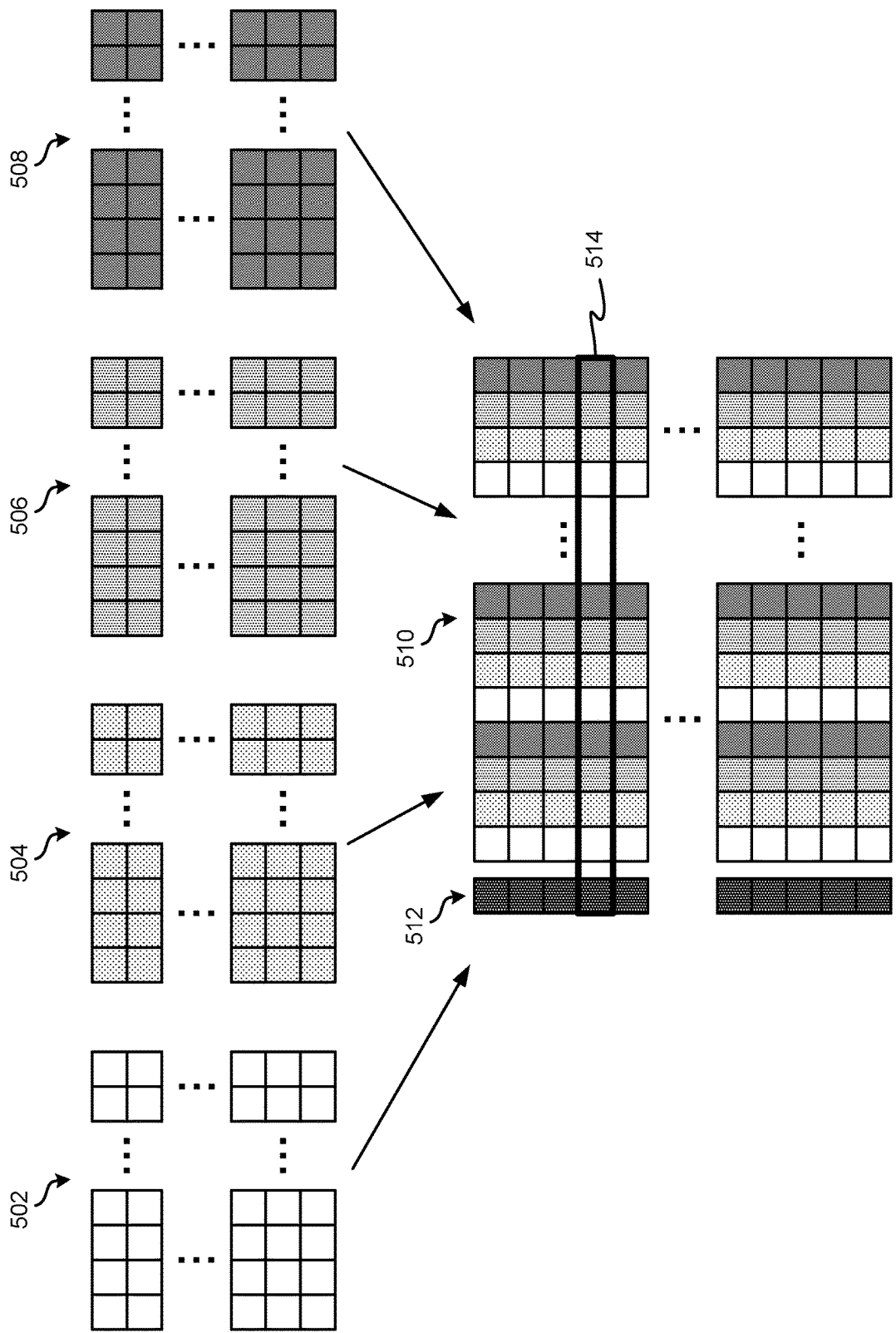
FIG. 5 shows a relationship between product codewords and a sub data set according to one embodiment.

Now referring to FIG. 5, the relationship between product codewords and a SDS is shown according to one embodiment. As shown, a SDS 510 comprises a plurality of headerized rows of encoded data interleaved together and arranged in a two-dimensional array. Each row of the SDS 510, such as row 514, includes a header 512 and symbols from each of a plurality of product codewords (PCWs) interleaved column by column. In the present example, four PCWs are included in the SDS 510: PCW 502, PCW 504, PCW 506, and PCW 508. However, any number of PCWs may be included in a SDS as would be apparent to one of skill in the art upon reading the present descriptions, such as 2, 6, 8, 10, 16, etc. Each PCW is shown as a two-dimensional array of encoded symbols, with the size of each PCW being determined based on any number of factors, such as available processing, past sizes used, backwards compatibility, convenience, etc.

In further approaches, the header 512 in each row of the SDS 510 may be of any length, such as 4 bytes, 6 bytes, 8 bytes, 12 bytes, 16 bytes, etc. Furthermore, the headers 512 may be encoded or un-encoded, depending on the amount of protection that is desired for the SDS 510. In other approaches, no headers 512 may be included for one or more of the rows of the SDS 510.

It is also noted that each row of the SDS 510, such as row 514, is a unit of data that may advantageously represent a packet used to store the SDS to magnetic tape. Therefore, when packets of data are read from the magnetic tape, each packet may represent a row of a SDS. Each packet, in one embodiment, has a size of about 1 kB: 4*240B (size of rows of each PCW)+12B (size of header). When a (192, 168) C2 code is used for encoding the data, there are 192 packets per SDS 510, and for a 32-channel tape drive, 64 SDSs are included in each data set, which is about 12 MB in size.

Figure 6:
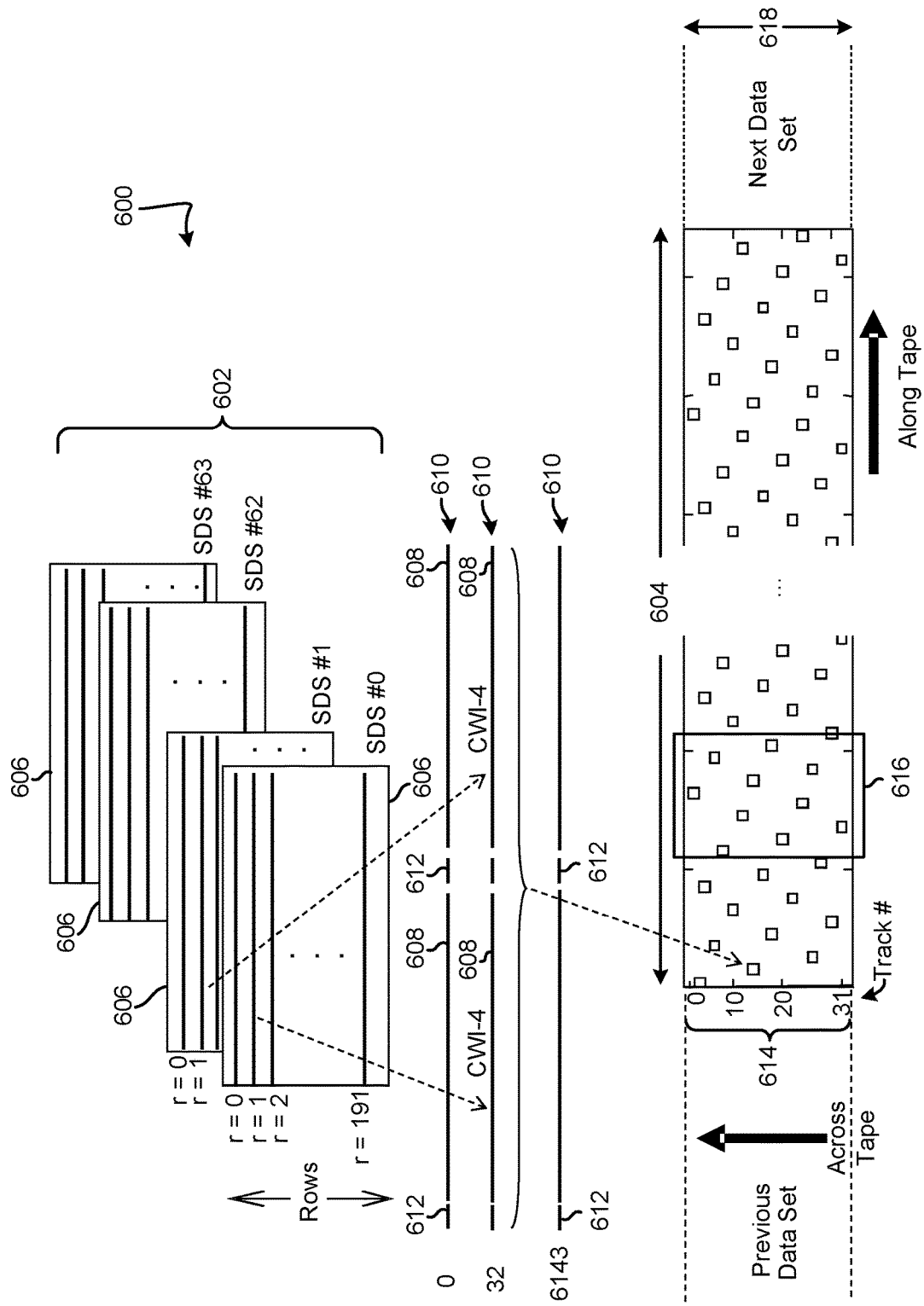
FIG. 6 shows a tape layout, according to one embodiment.

Referring now to FIG. 6, a data set layout 600 for a Reed-Solomon (RS) C2 code is shown according to one embodiment. Data set layout 600 is for a RS(192, 168) C2 code, but any suitable code may be used with the embodiments described herein, such as RS(96,84), etc. As shown, for RS(192, 168) the data set 602 size is 12 MB, the data set length 604 on the tape is 146 mm, each sub data set 606 has 192 sets of four interleaved codewords (CWI-4s) 608, a codeword object 610 includes two CWI-4s with the same number (r) from two consecutive sub data sets 606 with two headers 612, and there are 6144 codeword objects 610 per data set 602 mapped onto 32 logical tracks 614 such that a distance between CWI-4s is large, with each CWI-4 608 in SDS # x, x=0, 1, 2, ..., 63, being separated from all other CWI-4s 608 in SDS # x by about 1 mm allowing for the correction of four dead tracks and 18 mm stripe errors 616.

For example, as shown in FIG. 6, there are a total of 6144 codeword objects 610 of sub data set #0, sub data set #1, ..., and sub data set #63 within the data set layout 600. Also, the width 618 of the data set written to tape is about 2.6 mm in one approach, with the total width of the tape being about 12.7 mm.

Figure 7:
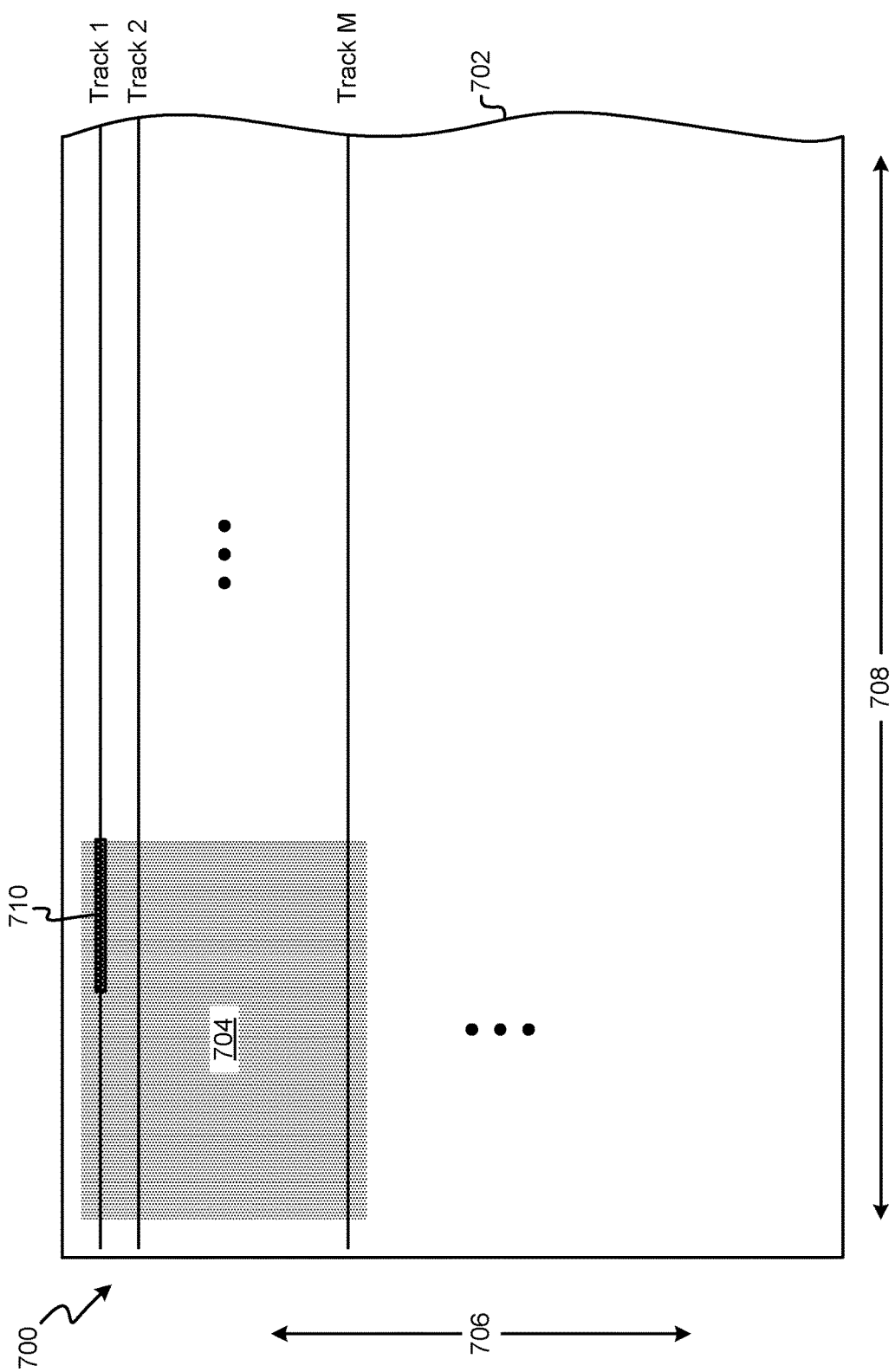
FIG. 7 shows a logical data format for storage to a magnetic tape according to the prior art.

With reference to FIG. 7, a logical format 700 for data storage on a magnetic tape 702 is shown, according to the prior art. As shown, a 2D logical array of data 704 is stored across tracks of the magnetic tape 702 that occupy a lateral range and longitudinal range on the magnetic tape 702. For this example, a tape drive along with the magnetic tape 702 are capable of providing 32 tracks to be written and read simultaneously, M=32.

Assuming a 50 nm bit length corresponding to a linear density of about 500 kbpi, the 2D logical array of data 704 occupies about 2.6 mm in the lateral direction 706 and about 80 mm in the longitudinal direction 708. Moreover, the data is arranged within the 2D logical array of data 704 as C1 codewords, e.g., C1 codeword 710, and C2 codewords, which are roughly equivalent to the size of the 2D logical array of data 704, as is understood by those of skill in the art. Each C1 codeword 710 within the 2D logical array of data 704 is a one-dimensional (1D) medium-spread (MS) codeword interleaved within a CWI-4, and occupies about 400 microns of space in the longitudinal direction 708 along a single track of the magnetic tape 702. Additionally, within the 2D logical array of data 704, each C2 codeword is a 2D wide-spread (WS) codeword and occupies the full 80 mm of space in the longitudinal direction 708 along the magnetic tape 702 and the full 2.6 mm of space in the lateral direction 706 across the magnetic tape 702, in this example. Moreover, symbols of a C2 codeword are approximately uniformly spread over the 2D logical array of data 704 in FIG. 7 similar to the squares at the bottom of FIG. 6 in the encoded data set layout 600 with borders indicated by the rectangular box in the longitudinal direction along the tape and the lateral direction across the tape.

The 2D logical array of data 704 may be written in a data track along the magnetic tape 702 with more than one data band being present on the magnetic tape 702 and capable of having more data stored therein. In another approach, different sets of some subset of the M tracks may be written simultaneously across one or more data bands on the magnetic tape 702 simultaneously using one or more subsets of M write head elements from a tape drive, as would be understood by one of skill in the art upon reading the present descriptions. For example, two data bands may be written simultaneously using M/2 write head elements for each of the two data bands, four data bands using M/4 write head elements for each of the four data bands, etc.

Also, the encoding may be performed by RS codes, e.g., $RS(N_1, K_1)$ for the C1 encoding may have $N_1=246$ and $K_1=234$ resulting in a RS(246, 234) code being used for encoding the C1 codewords, $RS(N_2, K_2)$ for the C2 encoding may have $N_2=96$ and $K_2=84$ resulting in a RS(96,84) code being used for encoding the C2 codewords. This results in P=256 product codewords (each occupying 96 bytes×246 bytes) within a data set.

As is evident from this scheme, the C2 code is stronger than the C1 code, as the C2 code is able to correct 6 symbols from a group of 96 symbols (# of correctable symbols for $C2=T2=(N_2-K_2)/2=(96-84)/2=12/2=6$), resulting in a code strength of 6.25% (C2 code strength=$T_2/N_2=6/96=1/16=0.0625$). In contrast, the C1 code is able to correct 6 symbols from a group of 246 symbols (# of correctable symbols for $C1=T_1=(N_1-K_1)/2=(246-234)/2=12/2=6$), resulting in a code strength of about 2.44% (C1 code strength=$T_1/N_1=6/246=1/41=0.0243902439$).

Referring again to FIG. 7, due to the logical format 700 used to store the data set, at least some of the C1 codewords 710 will be read from the magnetic tape 702 in their entirety prior to any of the C2 codewords being read in their entirety from the magnetic tape 702. But since the C1 code is weaker than the C2 code, and because the C1 codewords 710 are still medium spread along the magnetic tape 702, this is not useable for soft or hard decisions in the digital front-end functions due to the amount of latency that would be introduced into the read channels.

Figure 8:
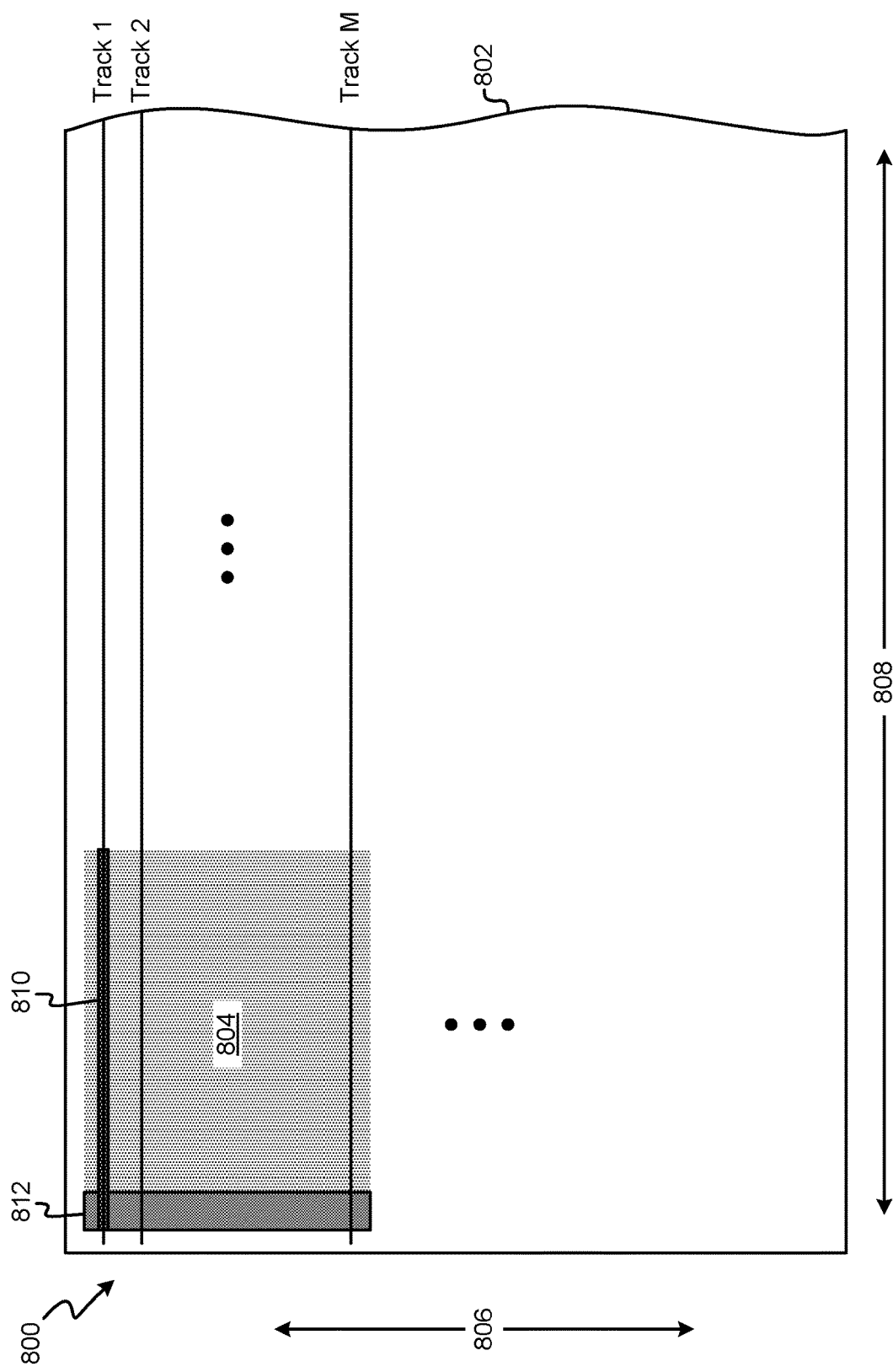
FIG. 8 shows a logical data format for storage to a magnetic tape according to one embodiment.

Now referring to FIG. 8, a logical format 800 for data storage on a magnetic tape 802 is shown, according to one embodiment. As shown, a 2D logical array of data 804 is stored across tracks of the magnetic tape 802 that occupy a lateral range and longitudinal range on the magnetic tape 802. For this example, a tape drive along with the magnetic tape 802 are capable of providing 32 tracks to be written and read simultaneously, M=32.

Assuming a 50 nm bit length corresponding to a linear density of about 500 kbpi, the 2D logical array of data 804 occupies about 2.6 mm in the lateral direction 806 and about 80 mm in the longitudinal direction 808. Moreover, the data is arranged within the 2D logical array of data 804 as NS codewords 812 and WS codewords 810. Each NS codeword 812 within the 2D logical array of data 804 is a 1D or 2D NS codeword (possibly interleaved with other NS codewords), and occupies as little as about 1.2 microns of space in the longitudinal direction 808 along a plurality of tracks (up to M tracks, thereby occupying the full 2.6 mm in the lateral direction) of the magnetic tape 802. Additionally, within the 2D logical array of data 804, each WS codeword is a 1D WS codeword and occupies the full 80 mm of space in the longitudinal direction 808 along a single track of the magnetic tape 802.

The encoding may be performed by RS codes, e.g., $RS(N_w, K_w)$ for wide-spread (WS) encoding may have $N_w=246$ and $K_w=234$ resulting in a RS(246, 234) code being used for encoding the WS codewords, $RS(N_n, K_n)$ for narrow-spread (NS) encoding may have $N_n=96$ and $K_n=84$ resulting in a RS(96,84) code being used for encoding the NS codewords. This results in P=256 product codewords (each occupying 96 bytes×246 bytes) within a data set.

As is evident from this scheme, the NS code is stronger than the WS code, as the NS code is able to correct 6 symbols from a group of 96 symbols, resulting in a code strength of 6.25%. In contrast, the WS code is able to correct 6 symbols from a group of 246 symbols, resulting in a code strength of about 2.44%.

Using this scheme, at least some of the NS codewords 812 will be read from the magnetic tape 802 in their entirety prior to any of the WS codewords 810 being read in their entirety from the magnetic tape 802. Moreover, since the NS code is stronger than the WS code, and because the NS codewords are narrow spread in a very compact longitudinal length along the magnetic tape 802, the NS codewords, when read from the magnetic tape 802, may be used for soft or hard decisions in digital front-end functions of the read channels of a tape drive.

For comparison sake, in the prior art logical format 700 described in FIG. 7 and common in current magnetic tape formatting, 1D MS row codewords consisting of $N_1$ bytes are written on tape tracks, whereas 2D WS column codewords consisting of $N_2$ bytes are written on M tape tracks. In the logical format 800 described in FIG. 8, according to one embodiment, 1D WS codewords consisting of $N_w$ bytes are written on tape tracks whereas 2D narrow-spread column codewords consisting of $N_n$ bytes are written on M tape tracks. The amount of length of tape occupied by a NS codeword in the longitudinal direction is about 333× less than the length occupied by a MS codeword. Further, the amount of length of tape occupied by a MS codeword in the longitudinal direction is about 200× less than the length occupied by a WS codeword.

Figure 9:
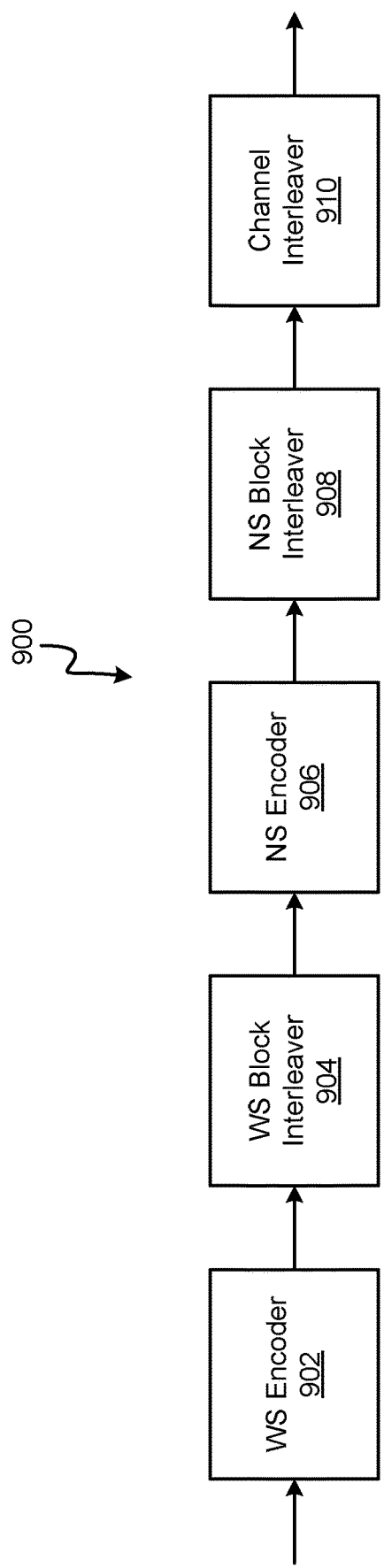
FIG. 9 shows a block diagram of a tape drive write channel, in accordance with one embodiment.

With reference to FIG. 9, a block diagram of a tape drive write channel 900 is shown according to one embodiment. This tape drive write channel 900 may be used to store data to magnetic tape according to the logic format described in FIG. 8, in one embodiment. Referring again to FIG. 9, the tape drive write channel 900 comprises a WS encoder 902, an optional WS block interleaver 904, a NS encoder 906, an optional NS block interleaver 908, and a channel interleaver 910.

The input to the WS encoder 902 is data having $P(K_n×K_w)$ symbols organized into $K_w$-byte rows. That is, the data input to the WS encoder 902 is organized into a 2D array having $K_n$ rows and $K_w$ columns. In this example, P is a number of product codewords in the data set having $P(K_n×K_w)$ symbols.

The WS encoder 902 is configured to operate using a rate-$K_w/N_w$ encoding scheme to encode the data having the $P(K_n×K_w)$ symbols and obtain data having $P(K_n×N_w)$ symbols, with $N_w$ being a number of columns more than $K_w$, e.g., $N_w>K_w$.

The WS block interleaver 904 is configured to interleave the data having the $P(K_n×N_w)$ symbols to obtain data having $K_n×PN_w$ symbols. The WS block interleaver 904 operates as a $PN_w$-column interleaver.

The NS encoder 906 is configured to operate using a rate-$K_n/N_n$ encoding scheme to encode the data having the $K_n×PN_w$ symbols and obtain data having $N_n×PN_w$ symbols. $N_n$ is a number of rows more than $K_n$, e.g., $N_n>K_n$.

The NS block interleaver 908 is configured to interleave the data having the $N_n×PN_w$ symbols to obtain data having $(PN_w/J)(N_n×J)$ symbols. The NS block interleaver 908 operates as a J-column interleaver.

The order of these blocks may be swapped in any desired order: the WS encoder 902, the optional WS block interleaver 904, the NS encoder 906, and the optional NS block interleaver 908. For example, the NS encoder 906, and the optional NS block interleaver 908 may be positioned prior to the WS encoder 902 and the optional WS block interleaver 904, in one alternate embodiment.

The channel interleaver 910 is configured to interleave the data having $(PN_w/J)(N_n \times J)$ symbols to obtain data having $(PN_w/J)(M \times (N_n/M)J)$ symbols so that it is suitable for writing to M tracks of the magnetic tape. Thereafter, the data having the $(PN_w/J)(M \times (N_n/M)J)$ symbols is written to the magnetic tape using M channels of a tape drive. In this description, M is an integer multiple of J, and $N_n$ is an integer multiple of M.

The NS code is a $(N_n, K_n)$ linear block code, e.g., a RS code, Low Density Parity Check (LDPC) code, etc., and the NS encoder 906 may be systematic in one embodiment. The WS code is a $(N_w, K_w)$ linear block code, e.g., RS code, LPDC code, etc., and the WS encoder 902 may be systematic in one embodiment. This results in a total code rate of $(K_n K_w)/(N_n N_w)$.

The WS block interleaver 904 performs depth-P symbol interleaving on each row (P equals the number of product codewords in the Data Set), and outputs $K_n$ bytes column by column, with P=256 for a Data Set having a size of about 6 MB, $N_w$=246, and $N_n$=96. Moreover, the NS block interleaver 908 is configured to cyclically shift every i-th row by (i−1) shifts, to output $N_n$-bytes in a column-by-column fashion.

In one embodiment, the WS block interleaver 904 may distribute symbols of the data along the M tracks of the magnetic tape as shown in FIG. 10. The entries of the table in FIG. 10 are denoted by $(i,j)_k$ corresponding to the i-th code symbol of the j-th WS codeword in row k of the table, where i is an integer number between 1 and $N_w$, j is an integer number between 1 and P, and k is an integer number between 1 and $K_n$. The entries of the table in FIG. 10 are typically m-bit symbols assuming the WS codewords are defined over the Galois field $GF(2^m)$. Note that m may be any positive integer number, such as 1, 4, 8, etc.

In another embodiment, referring again to FIG. 9, the NS block interleaver 908 may distribute symbols of the data along the M tracks of the magnetic tape as shown in FIG. 11, which may be referred to as a saw-tooth pattern as the NS codewords are distributed diagonally down and along the tracks. The $N_n J$ entries of the table in FIG. 11 having $N_n$ rows and J columns are denoted by $(i)_j$ corresponding to the i-th code symbol of the j-th NS codeword, where i is an integer number between 1 and $N_n$ and j is an integer number between 1 and J. The entries of the table in FIG. 11 are typically m-bit symbols assuming the NS codewords are defined over the Galois field $GF(2^m)$. Note that m may be any positive integer number such as 1, 4, 6, 8, 12, etc.

Figure 12:
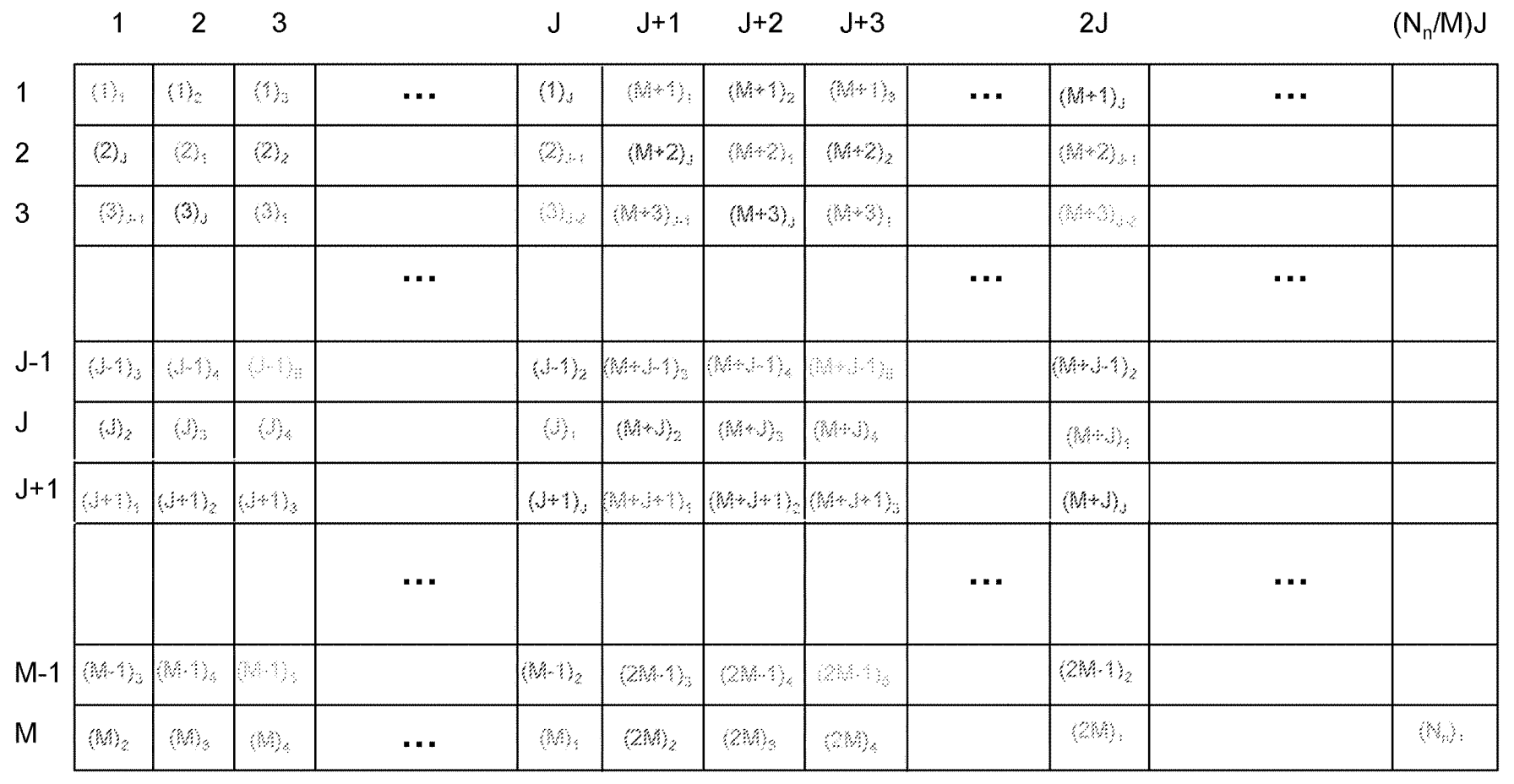

In yet another embodiment, referring again to FIG. 9, the channel interleaver 910 may distribute symbols of the data along the M tracks of the magnetic tape as shown in FIG. 12. The $N_n J$ entries of the table in FIG. 12 having M rows and $(N_n/M)J$ columns are also denoted by $(i)_j$ corresponding to the i-th code symbol of the j-th NS codeword, where i is an integer number between 1 and $N_n$ and j is an integer number between 1 and J. The entries of the table in FIG. 12 are typically m-bit symbols assuming the NS codewords are defined over the Galois field $GF(2^m)$. Note that m may be any positive integer number.

It is anticipated that the distribution patterns described in FIGS. 10-12 are used in conjunction to store the data to the M tracks of the magnetic tape in a particular embodiment.

Figure 13:
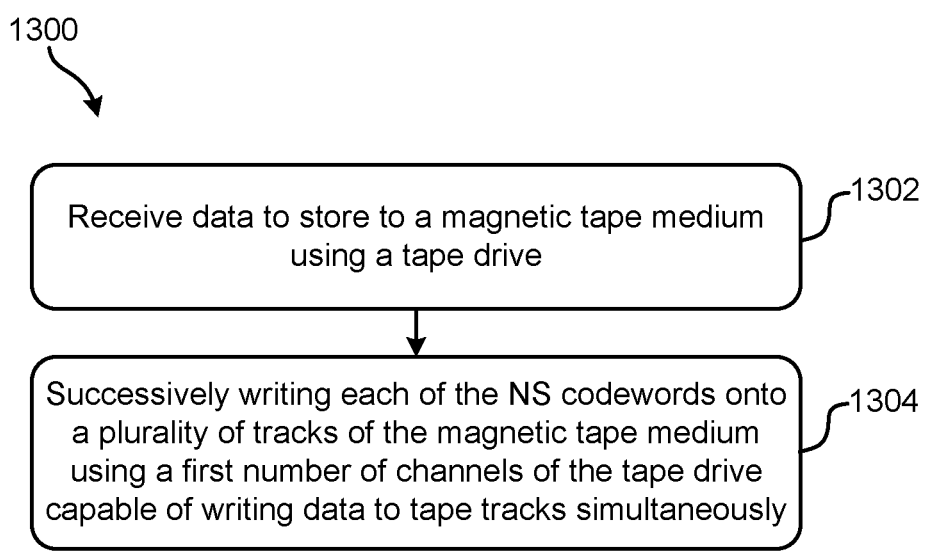
FIG. 13 shows a flowchart of a method, according to one embodiment.

Now referring to FIG. 13, a flowchart of a method 1300 for storing data on a magnetic tape medium is shown according to one embodiment. The method 1300 may be performed in accordance with the present invention in any of the environments depicted in FIGS. 1-12, among others, in various embodiments. Of course, more or less operations than those specifically described in FIG. 13 may be included in method 1300, as would be understood by one of skill in the art upon reading the present descriptions. Moreover, the order of the operations may be changed from that shown in FIG. 13.

In one approach, the tape medium may be any suitable magnetic data storage tape as known in the art, such as LTO tape formats, enterprise tape formats, etc. In other embodiments, although magnetic tapes are described throughout the descriptions, other data storage media may be used for data storage as would be understood by one of skill in the art.

Each of the steps of the method 1300 may be performed by any suitable component of the operating environment. For example, in various non-limiting embodiments, the method 1300 may be partially or entirely performed by a tape drive, an optical drive, a processor (such as a CPU, an ASIC, a FPGA, etc.) which may be embedded in and/or operate within a system, etc.

As shown in FIG. 13, method 1300 may initiate with operation 1302, where data to store to a magnetic tape medium using the plurality of write head elements is received.

The data is organized into a predetermined number (P) of two-dimensional arrays, each two-dimensional array comprising a plurality of NS codewords positioned orthogonally to a plurality of WS codewords. The WS codewords may be rows of the 2D array, while the NS codewords are columns of the 2D array, or vice versa, in various approaches.

In operation 1304, each of the NS codewords are successively written onto a plurality of tracks (M) of the magnetic tape medium using a first number of the plurality of write head elements capable of writing data to tape tracks simultaneously.

By successively being written, what is meant is that each NS codeword in a product codeword is completely written to the magnetic tape prior to another NS codeword from the same product codeword starting to be written to the magnetic tape. Moreover, the NS codewords are written across the plurality of tracks that are capable of being written and read simultaneously. Typically, not all tracks of the magnetic tape are used in this writing process, as each magnetic tape has many thousands of tracks, and only a portion thereof are able to be written simultaneously by a tape drive.

Further, a first NS codeword from a first two-dimensional array, e.g., a product codeword, is completely written to the magnetic tape medium prior to starting to write a second NS codeword from the first two-dimensional array. Also, the plurality of NS codewords are protected with a stronger encoding than the plurality of WS codewords.

In one embodiment, the stronger encoding is based on a higher correctable percentage of erroneous symbols in a NS codeword as compared to a correctable percentage of erroneous symbols in a WS codeword.

In another embodiment, the stronger encoding is based on T2/N2 being greater than T1/N1. In this equation, T1 equals floor(P1/2), N1 equals a length of a WS codeword, P1 is a WS codeword parity length and equals the WS codeword length minus a WS data word length (N1−W1). Also, T2 equals floor(P2/2), N2 equals a length of a NS codeword, P2 is a NS codeword parity length and equals the NS codeword length minus a NS data word length (N2−W2).

For example, when a RS($N_w$, $K_w$) code is used for the WS codewords, and $N_w$=246 and $K_w$=234 resulting in a RS(246, 234) code, the WS code is able to correct 6 symbols from a group of 246 symbols (# of correctable symbols for WS=$T_w$=($N_w$−$K_w$)/2=(246−234)/2=12/2=6), resulting in a code strength of about 2.44% (WS code strength=$T_w$/

$N_w = 6/246 = 1/41 = 0.0243902439$). In a further example, when a RS($N_n$, $K_n$) code is used for the NS codewords, and $N_n=96$ and $K_n=84$ resulting in a RS(96,84) code, the NS code is able to correct 6 symbols from a group of 96 symbols (# of correctable symbols for NS=$T_n=(N_n-K_n)/2=(96-84)/2=12/2=6$), resulting in a code strength of 6.25% (NS code strength=$T_n/N_n=6/96=1/16=0.0625$). Being able to correct 6.25% of the symbols recovered is stronger than being able to correct 2.44% of the recovered symbols.

Furthermore, more than one symbol of each NS codeword may be written to each of the plurality of tracks of the magnetic tape medium, in one embodiment. Also, a WS codeword, after being written to the magnetic tape medium, occupies at least (N1−1) times as much distance on the magnetic tape medium in the longitudinal direction than a NS codeword after being written to the magnetic tape medium in accordance with one embodiment.

Method 1300 may further include, in one approach, encoding a data set using two Reed-Solomon (RS) codes to produce the plurality of NS codewords and the plurality of WS codewords positioned orthogonally to each other within the predetermined number of two-dimensional arrays that represent the Data Set. Moreover, each NS codeword comprises a different portion of the Data Set and parity produced from the different portion of the Data Set, as described previously.

According to another embodiment, method 1300 may include byte-interleaving (NS and WS code symbols may be 8-bit symbols in one approach, but are not required to be, and may be greater than or less than 8-bits) a predetermined number of NS codewords together using a NS block interleaver to form byte-interleaved NS codewords prior to successively writing each of the NS codewords onto the plurality of tracks of the magnetic tape medium. The number of bytes along each track of the plurality of tracks of the magnetic tape medium occupied by the byte-interleaved NS codewords may be a multiple of a number of bytes occupied by a single NS codeword multiplied by J, corresponding to the predetermined number of NS codewords byte-interleaved together in this approach. Also, the predetermined number of NS codewords byte-interleaved together, J, may be selected from an inclusive range from 2 to 8 (e.g., the range includes 2, 3, 4, . . . , 8).

In another embodiment, the plurality of NS codewords may be written along a number of tracks of the magnetic tape medium equal to a maximum number of tracks that the tape drive is configured to write simultaneously. In these examples, the maximum number of tracks that may be written simultaneously is denoted by M, and therefore in this embodiment, the plurality of NS codewords are written along M tracks of the magnetic tape medium.

Each of the steps of method 1300 shown in FIG. 13 may be performed by any suitable component of the operating environment. For example, in various embodiments, method 1300 may be partially or entirely performed by a processing circuit, a controller, a tape drive, or some other device having one or more processors therein. The processing circuit, e.g., processor(s), chip(s), and/or module(s) implemented in hardware and/or software with connections therebetween, and preferably having at least one hardware component, may be utilized in any device to perform one or more steps of method 1300. Illustrative processing circuits include, but are not limited to, a CPU, a microprocessor, an ASIC, a FPGA, etc., combinations thereof, or any other suitable computing device known in the art.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic, software logic such as firmware, part of an operating system, part of an application program, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The logical format for data storage to magnetic tape described herein in various embodiments is based on encoding data words in a Data Set as P 2D product codewords (2D arrays) and writing the columns of the 2D product codewords as a narrow-spread 2D (or possibly 1D) encoded array across M tracks and uniformly distributing the symbols in the rows of the 2D product codewords (2D arrays) within the Data Set along a single track (or possibly along various tracks, without writing data from the same row on any two tracks at the same time). The error-rate performance is improved over the prior art because of the use of low-latency narrow-spread decoded symbols either to drive decision-directed digital front-end functions, such as timing recovery (single pass), or to perform iterative detection and timing recovery (multiple passes).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A tape drive, comprising:
   a processing circuit; and
   logic integrated with the processing circuit, executable by the processing circuit, or integrated with and executable by the processing circuit, the logic being configured to cause the processing circuit to:
   receive data to logically organized into a predetermined number of two-dimensional arrays, each two-dimensional army comprising a plurality of narrow-spread (NS) codewords positioned orthogonally to a plurality of wide-spread (WS) codewords; and
   successively write each of the NS codewords to a data storage medium, wherein a first NS codeword from a first two-dimensional array is written to the data storage medium prior to starting to write a second NS codeword from the first two-dimensional array, wherein the plurality of NS codewords are protected with a stronger encoding than the plurality of WS codewords.

2. The tape drive as recited m claim 1, wherein the stronger encoding is based on a higher correctable percentage of erroneous symbols in a NS codeword as compared to a correctable percentage of erroneous symbols in a WS codeword.

3. The tape drive as recited in claim 1, wherein the stronger encoding is based on T2/N2 being greater than T1/N1, wherein T1 equals floor(P1/2), N1 equals a length of a WS codeword, P1 is a WS codeword parity length and equals the WS codeword length minus a WS data word length, and wherein T2 equals floor(P2/2), N2 equals a length of a NS codeword P2 is a NS codeword parity length and equals the NS codeword length minus a NS data word length.

4. The tape drive as recited in claim 3, wherein the data storage medium is a magnetic tape medium, wherein more than one symbol of each NS codeword is written to each of a plurality of tracks of the magnetic tape medium, and wherein a WS codeword after being written to the magnetic tape medium occupies at least (N1−1) times as much distance on the magnetic tape medium in a longitudinal direction than a NS codeword after being written to the magnetic tape medium.

5. The tape drive as recited in claim 1, wherein the logic further causes the processing circuit to:
encode a data set using two Reed-Solomon (RS) codes to produce the plurality of NS codewords and the plurality of WS codewords positioned orthogonally to each other within the predetermined number of two-dimensional arrays that represent the data set,
wherein each NS codeword comprises a different portion of the data set and parity produced from the different portion of the data set.

6. The tape drive as recited in claim 1, wherein the logic further causes the processing circuit to:
byte-interleave a predetermined number of NS codewords together using a NS block interleaver to form byte-interleaved NS codewords prior to successively writing each of the NS codewords onto a plurality of tracks of the data storage medium,
wherein a number of bytes along each track of the plurality of tracks of the data storage medium occupied by the byte-interleaved NS codewords is a multiple of a number of bytes occupied by a single NS codeword multiplied by the predetermined number of NS codewords byte-interleaved together, and
wherein the predetermined number of NS codewords byte-interleaved together is in an inclusive range from 2 to 8.

7. A method, comprising:
receiving data logically organized into a predetermined number of two-dimensional arrays, each two-dimensional array comprising a plurality of narrow-spread (NS) codewords positioned orthogonally to a plurality of wide-spread (WS) codewords; and
successively writing each of the NS codewords to a data storage medium, wherein a first NS codeword from a first two-dimensional array is written to the data storage medium prior to starting to write a second NS codeword from the first two-dimensional array,
wherein the plurality of NS codewords are protected with a stronger encoding than the plurality of WS codewords.

8. The method as recited in claim 7, wherein the stronger encoding is based on a higher correctable percentage of erroneous symbols in a NS codeword as compared to a correctable percentage of erroneous symbols in a WS codeword.

9. The method as recited in claim 7, wherein the stronger encoding is based on T2/N2 being greater than T1/N1, wherein T1 equals floor(P1/2), N1 equals a length of a WS codeword, P1 is a WS codeword parity length and equals the WS codeword length minus a WS data word length, and wherein T2 equals floor(P2/2), N2 equals a length of a NS codeword, P2 is a NS codeword parity length and equals the NS codeword length minus a NS data word length.

10. The method as recited in claim 9, wherein the data storage medium is a magnetic tape medium, wherein more than one symbol of each NS codeword is written to each track of plurality of tracks of the magnetic tape medium, and wherein a WS codeword after being written to the magnetic tape medium occupies at least (N1−1) times as much distance on the magnetic tape medium in a longitudinal direction than a NS codeword after being written to the magnetic tape medium.

11. The method as recited in claim 7, further comprising:
encoding a data set using two Reed-Solomon (RS) codes to produce the plurality of NS codewords and the plurality of WS codewords positioned orthogonally to each other within the predetermined number of two-dimensional arrays that represent the data set, wherein each NS codeword comprises a different portion of the data set and parity produced from the different portion of the data set.

12. The method as recited m claim 7, comprising:
byte-interleaving a predetermined number of NS codewords together using a NS block interleaver to form byte-interleaved NS codewords prior to successively writing each of the NS codewords onto plurality of tracks of the data storage medium, wherein a number of bytes along each track of the plurality of tracks of the data storage medium occupied by the byte-interleaved NS codewords is a multiple of a number of bytes occupied by a single NS codeword multiplied by the predetermined number of NS codewords byte-interleaved together, and wherein the predetermined number of NS codewords byte-interleaved together is in an inclusive range from 2 to 8.

13. The method as recited in claim 7, wherein the data is received by a tape drive, wherein the data storage medium is a magnetic tape medium, and wherein the plurality of NS codewords are written along a number of tracks of the magnetic tape medium equal to a maximum number of tracks that the tape drive is configured to write simultaneously.

14. A computer program product, the computer program product comprising a computer readable storage medium having program instructions embodied therewith, the embodied program instructions being executable by a processing circuit to cause the processing circuit to:
receive, by the processing circuit, data logically organized into a predetermined number of two-dimensional arrays, each two-dimensional array comprising a plurality of narrow-spread (NS) codewords positioned orthogonally to a plurality of wide-spread (WS) codewords; and
successively write, by the processing circuit, each of the NS codewords to a data storage medium, wherein a first NS codeword from a first two-dimensional array is written to the data storage medium prior to starting to write a second NS codeword from the first two-dimensional array,
wherein the plurality of NS codewords are protected with a stronger encoding than the plurality of WS codewords.

15. The computer program product as recited in claim 14, wherein the stronger encoding is based on a higher correctable percentage of erroneous symbols in a NS codeword as compared to a correctable percentage of erroneous symbols in a WS codeword.

16. The computer program product as recited in claim 14, wherein the stronger encoding is based on T2/N2 being greater than T1/N1, wherein T1 equals floor(P1/2), N1 equals a length of a WS codeword, P1 is a WS codeword parity length and equals the WS codeword length minus a WS data word length, and wherein T2 equals floor(P2/2), N2 equals a length of a NS codeword, P2 is a NS codeword parity length and equals the NS codeword length minus a NS data word length.

17. The computer program product as recited in claim 16, wherein the data storage medium is a magnetic tape medium, wherein more than one symbol of each NS codeword is written to each of plurality of tracks of the magnetic tape medium, and wherein a WS codeword after being written to the magnetic tape medium occupies at least (N1−1) times as much distance on the magnetic tape medium in a longitudinal direction than a NS codeword after being written to the magnetic tape medium.

18. The computer program product as recited in claim 14, wherein the embodied program instructions are further executable by the processing circuit to cause the processing circuit to:
   encode, by the processing circuit, a data set using two Reed-Solomon (RS) codes to produce the plurality of NS codewords and the plurality of WS codewords positioned orthogonally to each other within the predetermined number of two-dimensional arrays that represent the data set, wherein each NS codeword comprises a different portion of the data set and parity produced from the different portion of the data set.

19. The computer program product as recited in claim 14, wherein the embodied program instructions are further executable by the processing circuit to cause the processing circuit to:
   bye-interleave, by the processing circuit, a predetermined number of NS codewords together using a NS block interleaver to form byte-interleaved NS codewords prior to successively writing each of the NS codewords onto a plurality of tracks of the data storage medium,
   wherein a number of bytes along each track of the plurality of tracks of the data storage medium occupied by the byte-interleaved NS codewords is a multiple of a number of bytes occupied by a single NS codeword multiplied by the predetermined number of NS codewords byte-interleaved together, and
   wherein the predetermined number of NS codewords byte-interleaved together is in an inclusive range from 2 to 8.

20. The computer program product as recited in claim 14, wherein the data storage medium is a magnetic tape medium, wherein the processing circuit is part of a tape drive, wherein the plurality of NS codewords are written along a number of tracks of the magnetic tape medium equal to a maximum number of tracks that the tape drive is configured to write simultaneously.

* * * * *